US007323759B2

United States Patent
Knipp et al.

(10) Patent No.: US 7,323,759 B2
(45) Date of Patent: Jan. 29, 2008

(54) PHOTOSENSOR FOR A TRANSMITTED LIGHT METHOD USED FOR DETECTING THE DIRECTION OF MOVEMENT OF INTENSITY MAXIMA AND INTENSITY MINIMA OF AN OPTICAL STANDING WAVE

(75) Inventors: Dietmar Knipp, Hennef (DE); Helmut Stiebig, Niederzier (DE); Hans-Joachim Büchner, Ilmenau-Unterpörlitz (DE); Gerd Jäger, Ilmenau (DE)

(73) Assignee: Forschungszentrum Jülich GmbH, Jülich (DE)

( * ) Notice: Subject to any disclaimer, the term of this patent is extended or adjusted under 35 U.S.C. 154(b) by 102 days.

(21) Appl. No.: 10/482,257

(22) PCT Filed: Jun. 12, 2002

(86) PCT No.: PCT/DE02/02135

§ 371 (c)(1),
(2), (4) Date: Mar. 8, 2004

(87) PCT Pub. No.: WO03/004965

PCT Pub. Date: Jan. 16, 2003

(65) Prior Publication Data
US 2004/0174527 A1    Sep. 9, 2004

(30) Foreign Application Priority Data
Jun. 29, 2001    (DE)    ................. 101 31 608

(51) Int. Cl.
*H01L 31/075*    (2006.01)

(52) U.S. Cl. ................ 257/458; 257/53; 257/462; 438/48; 438/57; 438/462

(58) Field of Classification Search ........ 257/E51.026, 257/458, 53, 462; 438/48, 57
See application file for complete search history.

(56) References Cited

U.S. PATENT DOCUMENTS

| | | | | |
|---|---|---|---|---|
| 4,441,789 A * | 4/1984 | Pohlack | ....................... | 359/588 |
| 5,389,797 A * | 2/1995 | Bryan et al. | ................... | 257/21 |
| 5,414,282 A * | 5/1995 | Ogura | ........................ | 257/187 |
| 5,621,750 A * | 4/1997 | Iwano et al. | ................... | 372/96 |
| 6,013,912 A * | 1/2000 | Pautrat et al. | .............. | 250/226 |
| 6,281,561 B1 * | 8/2001 | Stiebig et al. | .............. | 257/440 |
| 6,959,025 B2 * | 10/2005 | Jikutani et al. | .......... | 372/46.01 |
| 2001/0013912 A1 * | 8/2001 | Yamazaki et al. | .......... | 349/113 |

* cited by examiner

*Primary Examiner*—Zandra V. Smith
*Assistant Examiner*—Tsz Chiu
(74) *Attorney, Agent, or Firm*—Cohen Pontani Lieberman & Pavane LLP

(57) ABSTRACT

A photosensor for a transmitted-light method for detecting the intensity profile of an optical standing wave, with a transparent substrate, with a semiconductor component, and with at least three contacts, is characterized by the fact that two semiconductor components are connected with each other, such that the first semiconductor component and the second semiconductor component each have a photoelectrically active first semiconductor layer, and such that the two photoelectrically active semiconductor layers have a fixed phase relation to each other, which is adjusted by at least one photoelectrically inactive layer.

10 Claims, 2 Drawing Sheets

$$d_{s1} \le \frac{\lambda}{4n_{s1}}$$

$$d_{s2} \le \frac{\lambda}{4n_{s2}}$$

$$k\frac{\lambda}{8} = \sum_{j=1}^{I} d_j n_j + \frac{d_{s1}n_{s1}}{2} + \frac{d_{s2}n_{s2}}{2}$$

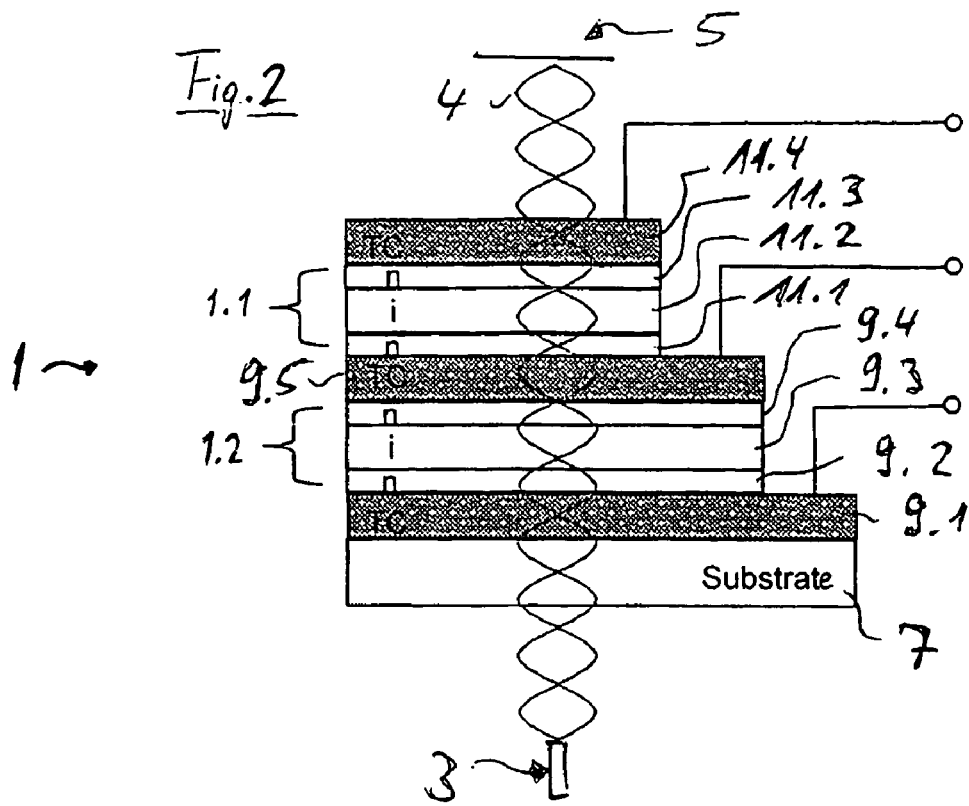
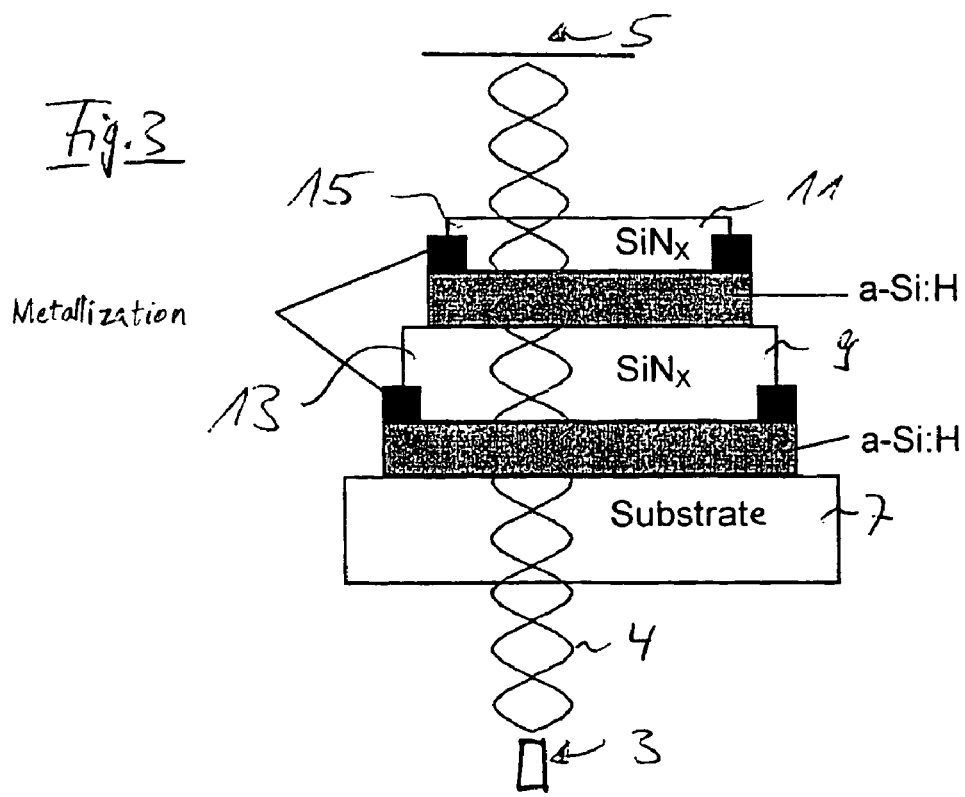

US 7,323,759 B2

PHOTOSENSOR FOR A TRANSMITTED LIGHT METHOD USED FOR DETECTING THE DIRECTION OF MOVEMENT OF INTENSITY MAXIMA AND INTENSITY MINIMA OF AN OPTICAL STANDING WAVE

PRIORITY CLAIM

This is a U.S. national stage of application No. PCT/DE02/02135, filed on 12 Jun. 2002. Priority is claimed on that application and on the following application(s): Country: Germany, Application No.: 101 31 608.9, Filed: 29 Jun. 2001.

BACKGROUND OF THE INVENTION

1. Field of the Invention

The invention concerns a photosensor for a transmitted-light method for detecting the direction of movement of the intensity maxima and intensity minima in an intensity profile, with a transparent substrate, two first semiconductor components assigned to the substrate, and at least three contacts.

2. Description of the Prior Art

In the field of photoelectric detection of visual radiation, photosensors that operate by a wide variety of principles are used, e.g., as photoresistors, photodiodes, phototransistors, or the like. A common feature of all of these designs is that the visual radiation is detected by the incident-light method. Typical applications for these types of photosensors are, e.g., light barriers or monitoring and security systems.

Another very specific area of application of photoelectric detection is optical interferometers. A typical example and one which is often used for technical length measurements is the Michelson interferometer, in which a beam splitter splits a light beam into two split beams, which then follow different paths and, after being reflected back to the beam splitter plate, are recombined at the plate. In accordance with the state of the art, two signals with a mutual phase shift of 90° are photoelectrically derived from the differential structure produced at the interferometer exit to detect the direction of movement of the measuring mirror. As in the case of all of the other photoelectric applications mentioned above, the detection of the radiation also occurs in incident light.

By contrast, when an optical standing wave forms, the two beams that produce the interference propagate in opposite directions. For this reason, the technical utilization and photoelectric evaluation of the result of the interference of an optical standing wave can be carried out only in transmitted light.

DE 33 00 369 and U.S. Pat. No. 4,443,107 describe designs for a standing-wave interferometer. In line with the requirements on interferometers for the automatic detection of the direction of movement of the measuring mirror, two photosensors are provided in each case, which generate two signals with a mutual phase shift of 90° for detecting the direction of movement of the measuring mirror. The photosensors are applied to a glass substrate, whose thickness must be finished with a precision of a few nanometers by the methods of optical precision finishing to maintain the 90° phase shift as precisely as possible. This requires the application of considerable technological resources, which is associated with high costs.

DE 36 12 221 describes placing a piezoelectrically active component between the two photosensors and making the distance between the sensors adjustable. Although this solution significantly reduces the expenditure of technological resources, it is still necessary, e.g., in the event of temperature changes, to detect any changes in the distance between the sensors and to adjust the distance.

SUMMARY OF THE INVENTION

This objective is achieved by a photosensor for detecting a direction of movement of the intensity maxima and intensity minima in an intensity profile of an optical standing wave using a transmitted-light method, the photosensor including a transparent substrate, first and second essentially transparent semiconductor components, and at least one of a contact layer and an insulating layer, wherein the first semiconductor component is connected with the second semiconductor component by the contact layer or the insulating layer, wherein the first semiconductor component includes a first transparent photoelectrically inactive semiconductor layer and a first transparent photoelectrically active semiconductor layer and the second semiconductor layer includes a second transparent photoelectrically inactive semiconductor layer and a second transparent photoelectrically active semiconductor layer. The first and second semiconductor components have a fixed phase relation to each other. The first photoelectrically active semiconductor layer of the first semiconductor component has a layer thickness $d_{s1}$ parallel to the direction of propagation of the standing wave of $d_{s1} \leq \lambda/4n_{s1}$, and the second photoelectrically active semiconductor layer of the second semiconductor component has a layer thickness $d_{s2}$ parallel to the direction of propagation of the standing wave of $d_{s2} \leq \lambda/4n_{s2}$, where $\lambda$ is the wavelength of the optical coherent wave, and $n_{s1}$ and $n_{s2}$ are the indices of refraction of the photoelectrically active semiconductor layers of the first and second essentially transparent semiconductors.

Therefore, the objective of the present invention is to realize a photosensor, in which the adjustment of the phase position between two photosensors is inexpensively integrated in the semiconductor production process sequence and therefore can be carried out with a high degree of precision, such that the effect on the phase position by outside influences, e.g., changes in the ambient temperature, is reduced to an irrelevant magnitude.

This objective is achieved by the characterizing features of claim 1.

The arrangement of at least two semiconductor components together on a substrate eliminates the expensive adjustment of the transparent photosensors. With two transparent photosensors produced on a common transparent substrate, a certain number 1 of essentially transparent layers with different functions are situated between the photoelectrically active layers of the two transparent photosensors.

If an optical standing wave is now produced by means of a laser and a plane mirror, and this substrate with the two transparent photosensors is arranged on the optical axis of the standing wave in such a way that the transparent photosensors are arranged one behind the other along the optical axis, the standing wave propagates through the substrate, the two transparent photosensors, and the functional layers. Starting from the photoelectrically active layer of the transparent photosensors, the following is obtained as the corresponding period: modified $$p = \frac{1}{\lambda} \cdot \sum_{j=1}^{l} d_j n_j$$

where $\lambda$ is the wavelength of the coherent radiation that is used, l is the number of semiconductor layers between the photoelectrically active layers, d is the layer thickness, and n is the index of refraction of the essentially photoelectrically inactive layer. If the period p is adjusted in such a way that it satisfies the condition modified $$p = \frac{k}{8} - \frac{d_{s1}n_{s1}}{2\lambda} - \frac{d_{s2}n_{s2}}{2\lambda},$$

where k=1, 3, 5, . . . then, if the plane mirror is displaced, there is a mutual phase shift of 90° or an odd multiple of 90° between the photoelectric signals produced by the photoelectrically active layers of the transparent photosensors.

A common feature of the transparent photosensors is that they produce a photocurrent as a function of the intensity profile in a standing wave. In this regard, an optimal detection condition for the photocurrent is that the layer thickness of the photoelectrically active layer of the transparent photosensor is $$d \leq \frac{\lambda}{4 \cdot n}$$

where $\lambda$ is the wavelength and n is the index of refraction of the photoelectrically active layer.

BRIEF DESCRIPTION OF THE DRAWINGS

In the drawings, wherein the like reference characters denote similar elements throughout the several views:

FIG. 2 is a schematic cross-sectional view of the photosensor according to the invention, in which a photocurrent flows parallel to the direction of propagation of the standing wave; and FIG. 3 is a schematic view of the photosensor of the invention, in which a photocurrent flows perpendicularly to the direction of propagation of the standing wave.

DETAILED DESCRIPTION OF THE PRESENTLY PREFERRED EMBODIMENTS

Figure 1:
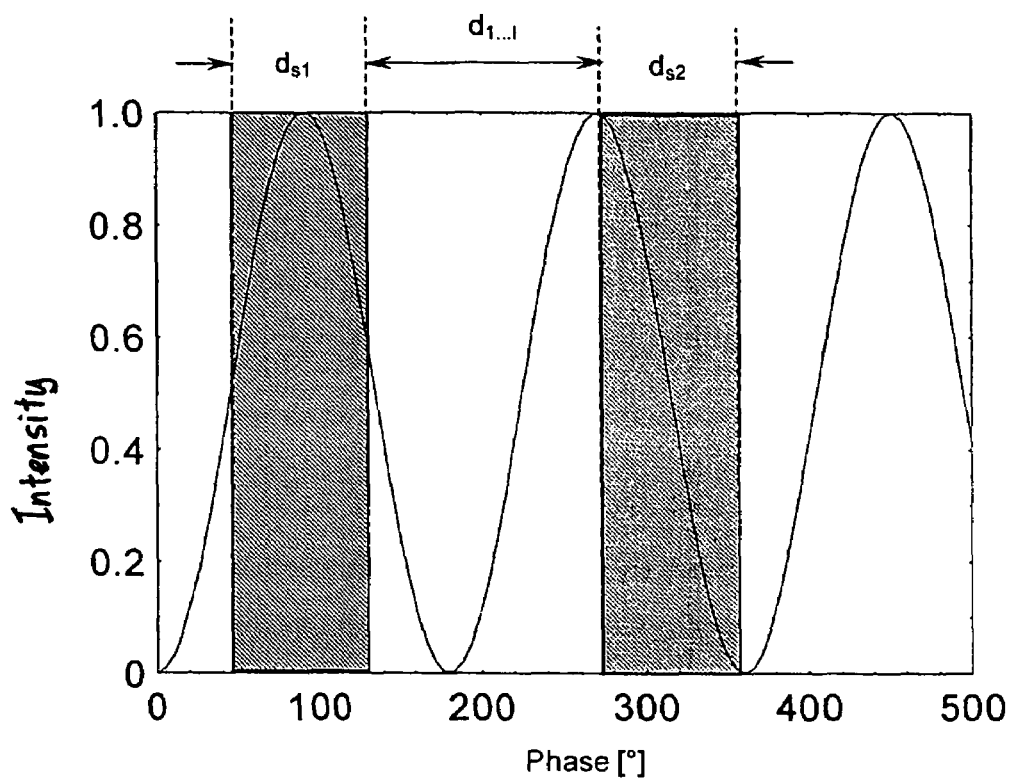
FIG. 1 is a graph showing the passage of a standing wave through a photosensor according to the present invention.

FIG. 1 shows a schematic diagram of the passage of a standing wave through a photosensor of the invention. The layer thickness of the photoelectrically active layers $d_{s1}$ and $d_{s2}$ is $$d_{s1} \leq \frac{\lambda}{4n_{s1}} \quad \text{Equation 1}$$

$$d_{s2} \leq \frac{\lambda}{4n_{s2}} \quad \text{Equation 2}$$

where $n_{s1}$ and $n_{s2}$ are the indices of refraction of the photoactive layers $d_{s1}$ and $d_{s2}$. In general, the phase condition may be described as modified $$\sum_{j=1}^{l} n_j d_j = k\frac{\lambda}{8} - \frac{d_{s1}n_{s1}}{2} - \frac{d_{s2}n_{s2}}{2} \quad \text{Equation 3}$$

FIG. 2 shows a cross section of a photosensor 1 of the invention, to which the diagram of FIG. 1 is to be applied.

The photosensor 1 is arranged between a radiation source 3 and a mirror 5. This arrangement is set up in such a way that the optical axis of a standing wave 4 produced by the radiation source 3 passes perpendicularly through the thickness of the photosensor 1 and is perpendicularly incident on the mirror. The photosensor 1 comprises a substrate 7, which may be composed of glass, quartz, or plastic. If a plastic substrate is selected, it may be formed especially as a plastic film. In the present embodiment, a series of semiconductor components 9, 11 (partial sensors 1.1 and 1.2) is formed on the mirror side of the substrate 7, i.e., on the side of the substrate 7 facing away from the radiation source 3. However, this is not necessarily the case in other embodiments. The substrate 7 and each semiconductor component 9 and 11 are essentially transparent in such a way that the standing wave 4 of the radiation source 3 can pass through the photosensor 1 to the mirror 5. A photocurrent is generated in each semiconductor component 9, 11 as a function of the intensity profile of the standing wave 4 by reflection of the standing wave 4 at the mirror 5.

The semiconductor component 9 applied on the substrate 7 comprises, in the following order, starting from the substrate 7, a transparent contact layer 9.1, a transparent first n-doped semiconductor layer 9.2, an intrinsic second semiconductor layer 9.3, an n-doped third semiconductor layer 9.4, and a second transparent contact layer 9.5. The second semiconductor component 11 comprises, in the following order, starting from the second contact layer 9.5, a transparent first n-doped semiconductor layer 11.1, an intrinsic second semiconductor layer 11.2, an n-doped third semiconductor layer 11.3, and a third transparent contact layer 11.4. The contact layers 9.1, 9.5, and 11.4, and the two sets of first, second, and third semiconductor layers 9.2, 9.3, 9.4, and 11.1 11.2, 11.3, respectively, are arranged in a plane-parallel fashion in the semiconductor components 9 and 11, respectively, each bordering on the next in order, and perpendicularly to the optical axis of the standing wave 4. The intrinsic second semiconductor layers 9.3 and 11.2 have layer thicknesses d parallel to the direction of propagation of the standing wave 4 of $d_{s1} \leq \lambda/4n_{s1}$ and $d_{s2} \leq \lambda/4n_{s2}$, where $\lambda$ is the wavelength of the optical coherent wave that is used, $n_1$ is the index of refraction of the photoelectrically active second semiconductor layer 9.3, and $n_2$ is the index of refraction of the photoelectrically active second semiconductor layer 11.2. The $n_{s2}$-doped semiconductor layers 9.2, 9.4, 11.1, and 11.3 are essentially photoelectrically inactive.

The fixed phase relation between electrically active semiconductor layers 9.3, 11.4 of the transparent photosensor 1 can be effected by means of at least one photoelectrically inactive semiconductor layer 9.2, 9.4, 11.1, 11.3 composed of amorphous, nanocrystalline, microcrystalline, polycrystalline, or crystalline silicon, germanium, carbon, nitrogen, oxygen, or alloys of these materials, or it may be produced from a transparent conductive oxide, e.g., $SnO_2$, ZnO, $In_2O_3$, or $Cd_2SnO_4$, which is doped with B, Al, In, Sn, Sb, or F. The choice of the semiconductor layer or semiconductor layers 9.2, 9.4, 11.1, 11.3, with which the phase relation is adjusted, depends on the choice of the transparent photosensor 1. The substrate 7 is produced from a material, which may be, e.g., a glass substrate, a quartz substrate, or a substrate made of plastic, especially a plastic film.

In the photosensor 1 in FIG. 2, the photocurrent flows parallel to the direction of propagation of the standing wave 4. nin-Structures, for example, are used as transparent semiconductor layers 9.2, 9.3, 9.4 and 11.1, 11.2, 11.3, but other well-known structures are also conceivable. The phase relation between the two semiconductor components 9 and 11 is adjusted for the second contact layer 9.5 (TCO layer), which simultaneously serves as the common contact for the two semiconductor components 9 and 11. To determine the layer thickness of the TCO layer (90° phase relation between the electrical signals), it is necessary to consider the effect of the two half, photoelectrically active, semiconductor layers 9.3 and 11.2 and of the two doped semiconductor layers 9.4 and 11.1, which border on the middle, second, transparent contact surface 9.5.

Alternatively, it is also possible to realize a structure in which the photocurrent flows perpendicularly to the direction of propagation of the standing wave 4. A photosensor 1 of this type is shown in FIG. 3. In this case, for example, the photoconductivity of an amorphous semiconductor layer is used as the transparent photosensor 1. The contact layers consist, for example, of aluminum coatings applied by vapor deposition. In this design, it is not necessary for the contact layers to be transparent. To achieve better contact, doped regions may be introduced or applied below the metal contacts. In this case, the phase relation can be adjusted by an insulating layer 13 applied between the two semiconductor components 9, 11. For example, a silicon nitride layer is indicated in FIG. 3. This layer insulates the two semiconductor components 9, 11 from each other and provides for a phase relation of 90°. A second insulating layer 15, likewise in the form of a silicon nitride layer, is applied to the semiconductor component 11 and is designed to improve the optical adaptation of the layered system to the conditions of the standing wave. The use of these additional semiconductor layers makes it possible to optimize the layered structure with respect to minimum reflection and maximum transmission.

For several reasons, especially amorphous, nanocrystalline, microcrystalline, and crystalline silicon and its alloys are suitable for the realization of a semiconductor sensor. For example, amorphous and microcrystalline silicon can be produced on various materials, such as glass, quartz, or plastic film, in a low-temperature process (deposition temperature 200-300° C.) by plasma-enhanced chemical vapor deposition (PECVD). In this regard, the transparent and conductive layers are used as contact layers. Due to the possibility of depositing thin amorphous and microcrystalline layers on transparent substrates at low temperatures, these layers are very well suited as absorber materials for a semiconductor sensor in transmitted-light operation. Thus, it is possible to produce very thin layered systems by systematic control of the process parameters during production.

The transparent and electrically conductive layers (TCO layers) can be produced, for example, by a CVD process, spray pyrolysis, vaporization process, and sputtering process. Like the PECVD process, this process is also a low-temperature process.

What is claimed is:

1. A photosensor for detecting a direction of movement of the intensity maxima and intensity minima in an intensity profile of an optical standing wave using a transmitted-light method, said photosensor comprising:
    a transparent substrate;
    first and second essentially transparent semiconductor components; and
    at least one of a contact layer and an insulating layer, wherein said first semiconductor component is connected with said second semiconductor component by said one of said contact layer and said insulating layer,
    wherein said first semiconductor component includes a first transparent photoelectrically inactive semiconductor layer and a first transparent photoelectrically active semiconductor layer and said second semiconductor layer includes a second transparent photoelectrically inactive semiconductor layer and a second transparent photoelectrically active semiconductor layer, said first and second semiconductor components having a fixed phase relation to each other, said first photoelectrically active semiconductor layer of said first semiconductor component having a layer thickness $d_{s1}$ parallel to the direction of propagation of the standing wave of $d_{s1} < \lambda / 4 n_{s1}$, and said second photoelectrically active semiconductor layer of said second semiconductor component having a layer thickness $d_{s2}$ parallel to the direction of propagation of the standing wave of $d_{s2} < \lambda / 4 n_{s2}$, where $\lambda$ is the wavelength of the optical coherent wave, and $n_{s1}$ and $n_{s2}$ are the indices of refraction of the photoelectrically active semiconductor layers of said first and second essentially transparent semiconductors; and
    wherein said first and second semiconductor components comprise one of photoconductors, Schottky barrier diodes, pin, nip, pip, nin, npin, pnip, pinp, nipn structures, and combinations of these structures, wherein a charge transfer within said photosensors is applicable either parallel to or perpendicularly to the direction of propagation of the standing wave.

2. The photosensor of claim 1, wherein said fixed phase relation of said first and second essentially transparent semiconductors is $$k\frac{\lambda}{4} = \sum_{j=1}^{l} d_j n_j + \frac{d_{s1} n_{s1}}{2} + \frac{d_{s2} n_{s2}}{2},$$

wherein k is an odd whole number, $\lambda$ is the wavelength of the coherent radiation that is used, l is the number of semiconductor layers used between the active semiconductor layers of said first and second semiconductor components, $d_{s1}$ is the layer thickness of the first photoelectrically active semiconductor layer, $d_{s2}$ is the layer thickness of the second photoelectrically active semiconductor layer of the second semiconductor component, $d_1 \ldots d_l$ are the layer thicknesses of the semiconductor layers between the active semiconductor layers of said first and second semiconductor components, $n_1 \ldots n_l$ are the indices of refraction of the semiconductor layers between the active semiconductor layers of said first and second semiconductor components, $n_{s1}$ is the index of refraction of the first photoelectrically active semiconductor layer, and $n_{s2}$ is the index of refraction of the second photoelectrically active semiconductor layer.

3. The photosensor of claim 1, wherein said transparent substrate is transparent to the coherent radiation of wavelength $\lambda$.

4. The photosensor of claim 1, wherein at least one of the semiconductor layers is composed of a material selected from the group consisting of amorphous material, microcrystalline material, polycrystalline material, and crystalline material.

5. The photosensor of claim 1, wherein at least one of the semiconductor layers is composed of a material selected from the group consisting silicon, germanium, carbon, oxygen, nitrogen, an alloy of these materials, transparent conductive oxides, and thin metal films.

6. The photosensor of claim 1, wherein said transparent substrate comprises a material selected from the group consisting of glass, quartz, and plastic film.

7. The photosensor of claim 1, wherein each contact layer comprises a material selected from the group consisting of $NO_2$, $ZnO$, $In_2O_3$, and $Cd_2SnO_4$, which are doped with an element from the group comprising B, Al, In, Sn, Sb, and F, thin metal films, and semiconducting layers.

8. The photosensor of claim 1, further comprising a layer formed on each of said first and second semiconductor components for the optical adaptation of the semiconductor component.

9. The photosensor of claim 1, wherein said photosensor is designed as a one-dimensional or two-dimensional sensor field.

10. The photosensor of claim 1, wherein said photosensor is configured to be disposed in an optical path of a standing wave produced external to the photosensor.

\* \* \* \* \*